United States Patent [19]

Rauschenbach et al.

[11] Patent Number: 5,040,020

[45] Date of Patent: Aug. 13, 1991

[54] SELF-ALIGNED, HIGH RESOLUTION RESONANT DIELECTRIC LITHOGRAPHY

[75] Inventors: Kurt Rauschenbach, Marlborough, Mass.; Charles A. Lee, Ithaca, N.Y.

[73] Assignee: Cornell Research Foundation, Inc., Ithaca, N.Y.

[21] Appl. No.: 430,290

[22] Filed: Nov. 2, 1989

Related U.S. Application Data

[62] Division of Ser. No. 176,274, Mar. 31, 1988, Pat. No. 4,898,804.

[51] Int. Cl.$^5$ ............................................. G03B 27/42
[52] U.S. Cl. ...................................... 355/53; 355/67; 355/71
[58] Field of Search .................... 430/311; 355/53, 67, 355/26, 71

[56] References Cited

U.S. PATENT DOCUMENTS

| | | |
|---|---|---|
| 3,573,975 | 4/1971 | Dhara et al. . |
| 4,102,683 | 7/1978 | DiPiazza . |
| 4,346,164 | 8/1982 | Tabarelli et al. . |
| 4,371,598 | 2/1983 | Medernach et al. . |
| 4,458,994 | 7/1984 | Jain et al. ................................. 354/4 |
| 4,490,457 | 12/1984 | Kardashian et al. . |
| 4,507,845 | 4/1985 | McIver et al. . |
| 4,529,685 | 7/1985 | Borodovsky . |
| 4,537,654 | 8/1985 | Berenz et al. . |
| 4,543,319 | 9/1985 | Chao et al. . |
| 4,551,904 | 11/1985 | Berenz et al. . |
| 4,557,986 | 12/1985 | Blais . |
| 4,557,995 | 12/1985 | Broers et al. . |
| 4,905,037 | 2/1990 | Yamamoto et al. ................. 355/71 |

Primary Examiner—Monroe H. Hayes
Attorney, Agent, or Firm—Jones, Tullar & Cooper

[57] ABSTRACT

Methods of fabricating electrical contacts on both sides of a thin membrane to form a millimeter wave, self-aligned, opposed gate-source transistor are disclosed. The transistor structure has a subhalf-micron gate, dual-drains placed symmetrically around both sides of the gate, and a source approximately half the length of the gate. The source is directly opposite, and centered under, the gate on the opposite surface of a semiconductor thin film. The gate electrode is fabricated on the first surface of the thin film using conventional single surface lithography, and is used as a conformed mask for the source lithography, thereby self-aligning the source to the gate. The source is formed by resonant dielectric lithography, wherein the gate side of the thin film is irradiated by collimated ultraviolet light to expose a negative resist on the source side with a resolution of less than a wavelength. Lateral diffraction effects affect the relative dimension of the source with respect to the gate. The electron-beam lithographic process utilizes electron scattering in the thin film for the same purpose. This new untraviolet lithography process avoids the need to handle the thin film until after source metallization has been completed.

7 Claims, 4 Drawing Sheets

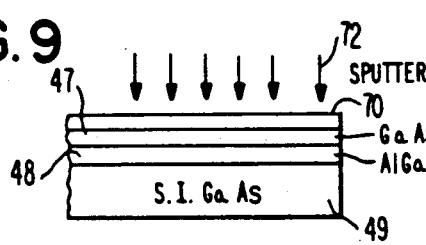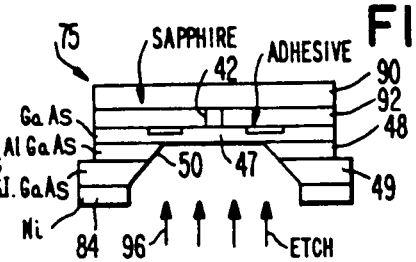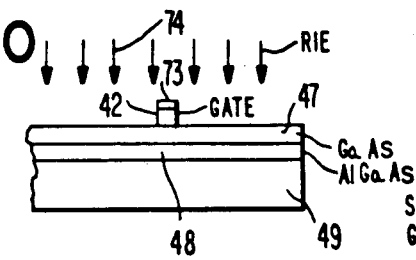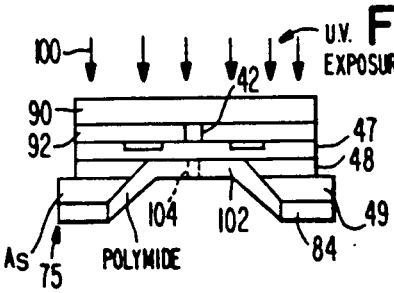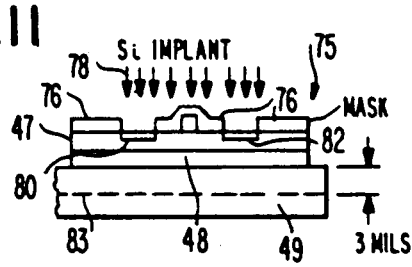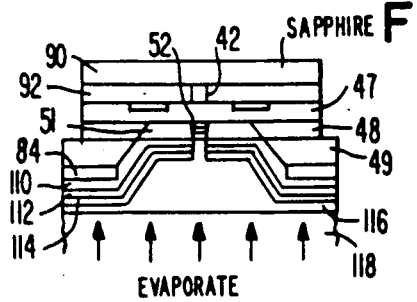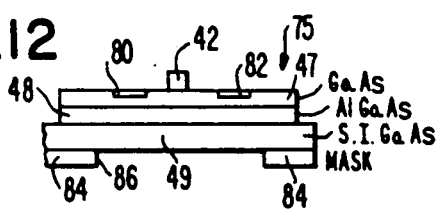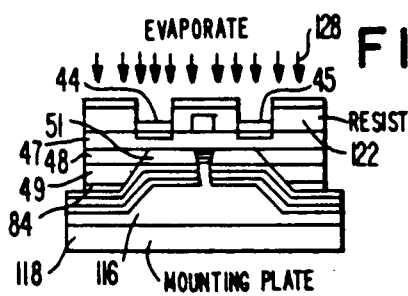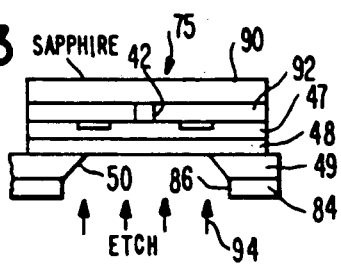

SELF-ALIGNED, HIGH RESOLUTION RESONANT DIELECTRIC LITHOGRAPHY

This invention was made with Government support under Grant No. N66001-83-C-0363, awarded by the Defense Advanced Research Projects Agency. The Government has certain rights in the invention.

This is a divisional of copending application Ser. No. 07/176,274 filed on 3/31/88, U.S. Pat. No. 4,898,804.

The present invention relates, in general, to resonant dielectric techniques for increasing optical resolution, and more particularly to resonant dielectric lithography in the production of opposed gate-source transistor devices, where high resolution, precise alignment, and close relative dimensional control of electrodes on opposite surfaces of a thin film semiconductor are required.

As is widely known, a field effect transistor (FET) is a three-terminal amplifying or switching semiconductor device in which charge carriers flow along an active channel region between a source terminal and a drain terminal. When a bias voltage is applied to a gate terminal adjacent to the channel, a carrier depletion region is formed in the channel and the current flow is correspondingly inhibited. In a conventional FET, the source and drain terminals make ohmic contacts with source and drain semiconductor regions of the same conductivity type, and the active channel takes the form of a planar layer extending between the source and drain regions. The gate terminal makes a blocking contact with the active channel at a point between the source and drain terminals.

The performance of a conventional FET, and most semiconductor switching devices available at the present time, is limited at high frequencies by the source resistance, the source inductance (which reduces the transconductance), and by other circuit parasitics, or internal impedances, associated with the device and with its input and output connections. Various attempts have been made to design field effect transistors that reduce these parasitic impedances so as to permit an increase in their frequency of operation, and significant improvements have been accomplished in such devices by positioning the gate and the source on opposite faces of the channel. In devices such as that illustrated in U.S. Pat. No. 4,551,904 to Berenz et al., the source and gate are located on opposite surfaces of the semiconductor channel region, with the source having a length about one-half that of the physical gate length and being located symmetrically under the gate. Further, two separate drains are located at opposite ends of the channel region, and current flows in two parallel paths from the source to the two drains. In this parallel configuration, the incremental transconductance per unit width is approximately twice that of a single conventional FET of similar design, thus improving the high frequency performance of the device. The opposed gate-source configuration permits the source to be integrated into a metallized ground plane, and this arrangement practically eliminates source resistance and source inductance, thereby further improving high frequency performance.

To permit operation at extremely high frequencies, for example at frequencies over 100 Gigahertz (GHz) where the wave length is three millimeters (mm) or less, the dimensions of the FET structure must be significantly reduced, however, and it is extremely difficult to fabricate such devices with any significant degree of reliability. One of the major problems in such fabrication arises from attempts to align the source and the gate with the required accuracy when the source and the gate electrodes are not only extremely small, but are also formed on opposite sides of a substrate, as in the opposed gate-source configuration described above. In one aspect, therefore, the present invention is directed to methods of fabricating opposed gate-source transistor (OGST) devices and particularly such devices which are capable of operating at extremely high frequencies. More generally, the invention relates to resonant dielectric techniques for increasing optical resolution in a variety of applications.

There are numerous advantages to OGST devices, for their structure minimizes the limitations placed on the frequency of operation of FET devices by circuit parasitics. Thus, for example, an OGST device incorporates integrated input and output transmission lines, with the impedance of the input lines being matched to that of the gate, and the impedance of the output lines being matched to that of the drain in order to eliminate discontinuities between the transistor and any devices to which it is connected. Furthermore, in an OGST structure, impedance and phase matching between the input and output lines allows input power to add as the square of gate width. This provides substantially greater power per unit gate width than is available from paralleled lumped element transistors, where power adds only linearly. A further advantage of the OGST device is that source resistance is at an absolute minimum, since the source is connected directly to the active layer, with no intervening resistive semiconductor layer. In addition, source inductance is minimized, since the source is spread out to form a common ground plane between the gate and the drain. This integrates the source into the ground plane, and eliminates the need for a via hole.

Additional advantages of the OGST structure include the fact that its effective gate length is less than half the physical gate length, and the fact that the transconductance of the device is effectively double that of a conventional field effect device structure with equivalent gate length because of the dual-drain configuration. The integrated ground plane also improves heat dissipation. Further, the open transmission line geometry of the OGST structure reflects the input and output signals in phase, minimizing the losses on the transmission line.

These numerous advantages of the opposed gate-source transistor device would justify the difficult fabrication of such devices if the very small dimensions and precise alignment required for millimeter wave operation could be achieved practically and reliably. But this has not been possible, and as a result the OGST device has received little commercial attention. A primary cause of the difficulty in fabricating such devices is the problem of obtaining precisely vertically aligned patterns on opposite surfaces of an active semiconductor layer. Attempts have been made to accomplish this by providing mechanical alignment of lithographic masks on opposite sides of the active layer or by using a transparent active layer with a single mask. However, no mechanical alignment technique is available which is capable of aligning a gate and source with the tolerances and dimensions required for millimeter wave operation. Vertical alignment has also been attempted by using optical lithography techniques in which a single mask is used to expose both sides of an active layer.

Such techniques primarily rely on the use of transparent layers, but these have produced problems of diffraction and reflection. Reflections produce standing waves in the exposing radiation in the various regions between the mask, the two resist layers, and the active layer, and such standing waves adversely affect the resolution obtainable through the lithographic process. Typically, lithographic resolution is about two wavelengths, or about 0.75 micron at the mid-ultraviolet portion of the spectrum.

Electron-beam techniques have been used to define patterns on both sides of an active layer, in order to solve the foregoing problems. External masks or electron-beam writing techniques have been used to form identical radiation patterns on both sides of the layer, as by writing a contamination mask. However, the literature indicates that the removal of contamination resist layers has not been developed yet as a practical process step. Furthermore, contamination masks result in a great deal of scattering and, accordingly, the resolution required for defining the electrodes in an OGST device are not obtainable.

A further difficulty which is encountered in the manufacture of OGST devices is that the active semiconductor layers on which they are formed are extremely fragile and must be fully supported during the fabrication process. This is difficult to accomplish when dual-surface lithography is used, for both surfaces must be available for the application of resist material, exposure by the radiation source, and development. The more these fragile layers, or thin films, are handled in the fabrication process, the higher is the likelihood of breakage. Further, if a supporting medium is used, then that medium must be transparent to the exposing radiation, and it must not cause scattering and reflection problems which make it difficult to obtain high resolution of the exposure.

SUMMARY OF THE INVENTION

The problems that have been encountered in prior fabrication techniques are overcome, in accordance with the present invention, through the use of dual-surface fabrication processes which may be referred to as dual-surface resonant dielectric lithography (RDL) and dual-surface electron-beam lithography. In these processes, self-alignment of components on opposite sides of a thin, active semiconductor layer is attained by dual-surface exposure of resist materials through a thin film which is sufficiently transparent to radiation impinging on one surface to expose a resist material on the other surface. The exposing radiation may be either collimated ultraviolet light, in the case of RDL, or may be an electron-beam, in the case of electron-beam lithography. In the preferred form of the invention, dual-surface thin film devices are fabricated through the use of ultraviolet light at a frequency which is at or near a frequency which produces a resonant dielectric increase in thin film material.

RDL applies most directly to self-aligned dual-surface lithography on semiconductors. In this case the resonant dielectric medium is naturally situated between the mask and the photosensitive layer. An electrode is fabricated conventionally on the top surface of a thin substrate. This electrode serves as a contact to one surface and a conformal mask for the lithography on the opposing surface. A photosensitive material, sensitive to the same energy that produces a resonant dielectric increase in the substrate, is applied to the bottom surface of the thin substrate. The top surface is exposed to radiation with an energy matched to a resonant dielectric peak in the substrate. The radiation passes through the high dielectric substrate, activating the photosensitive material with the energy of the incident radiation. The resulting developed image has extremely high resolution and is self-aligined to the previously fabricated electrode on the top surface of the thin substrate. Extremely high resolution occurs for several reasons. The resonant dielectric increase in the substrate results in a large reduction in the effective wavelength of the exposing radiation, and this greatly reduces the dimensions at which diffraction limits the obtainable resolution. In addition, absorption within the substrate eliminates standing wave patterns that would be caused by reflections between the mask and the interfaces, further increasing resolution. The perfectly intimate contact between the mask and the substrate reduces edge diffraction. Further, the increase in the refractive index self-collimates the radiation, effectively reducing the dimension of the conformal mask. Lastly, relative dimensional control of the resist image to the conformal mask can be achieved by manipulating the exposure time-intensity product for known resist contrast properties.

The resolution obtainable by conventional optical lithography is limited by the wavelength of the incident radiation, with the maximum resolution being typically about two wavelengths, as indicated above. This limits the resolution of mid-UV lithography to about three-quarters of a micron. RDL, on the other hand, has achieved dimensions below one-quarter micron using standard mid-UV optical lithography equipment and chemicals. RDL thus makes the fabrication of OGST structures with the dimensions required for millimeter wave operation practical for the first time and represents a significant advance in the art of conventional and especially of dual-surface lithography, and can be used for the fabrication of other high speed electronic and optical devices.

This novel RDL technique for increasing the resolution of optical systems can be extended to planar lithography and microscopy, and can be applied to both planar proximity and projection lithography. In resonant dielectric planar lithography a fluid or thin solid film, resonant at or near the energy of the incident radiation, is deposited between the photosensitive material and the mask. This increases the resolution in the same way as dual-surface RDL. In a resonant dielectric microscope, a fluid or thin solid film, resonant at or near the energy of the observing radiation, is deposited between the object and the first element of the objective. This will greatly increase the numerical aperture of conventional microscopes. Resolution increases with the refractive index of the fluid in two ways. Firstly, the refractive fluid reduces the effective wavelength of the light between the object and the first element of the objective, reducing diffraction effects. Secondly, the refractive fluid decreases the angular divergence in the object space and, therefore, admits a wider cone of rays, increasing the resolution by the sine of the angular increase.

In a preferred form of the invention, the active layer is a gallium arsenide (GaAs) semiconductor thin film having a thickness of about 200 nm, and the exposing radiation is ultraviolet light having a wavelength of 436 nm. Although other materials and radiation sources can be used, this combination is particularly advantageous because the spectral G-line of mercury has a wavelength of 436 nm. This wavelength coincides with the occurrence of a resonant dielectric increase in gallium arsenide, which has a refractive index peak at a value of 5.1 at 436 nm. This is an especially convenient wavelength, since most optical lithographic systems can operate efficiently at it. Although gallium arsenide thin films are not totally transparent at this wavelength, the power density of the incident radiation can be increased to compensate for the absorption of radiation which takes place in the active layer.

A typical OSGT device is fabricated on a support wafer which includes a semi-insulating substrate such as gallium arsenide; however, any semiconductor material can be used as the substrate with only minor modifications to the fabrication process. An etch stop layer of AlGaAs material is grown on the semi-insulating GaAs substrate, and thereafter, an n-type GaAs epitaxial active layer is grown on the AlGaAs material to form the wafer. The fabrication process is carried out on the substrate and on its active layer, with the process being generally independent of the structure of the wafer, as long as it contains an etch stop layer. A wide variety of devices can be fabricated using this process, with only minor changes, even though the principle of operation of such devices may differ from a conventional dual-surface FET. Thus, various modifications in the material as well as in the process can be made without departing from the present invention.

As a first step in the fabrication process of an OGST device utilizing the resonant dielectric lithography technique of the present invention, one or more high aspect-ratio tungsten gate electrodes are constructed on the top surface of the GaAs active layer of the wafer using conventional techniques. Electrodes having dimensions of less than one-quarter of a micron in length and greater than one micron in height can be achieved with insignificant undercut using such techniques. A layer of tungsten is first deposited on the active GaAs layer, and a nickel etch mask is fabricated by deposition of a resist layer, positive direct write electron-beam lithography, nickel evaporation and lift off. The negative image of the tungsten gate is etched away by reactive ion etching (RIE). A high aspect-ratio gate can be fabricated with minimum undercutting by using very low power densities and bias voltages. It is usual to fabricate a large number of OGST devices on a single wafer, and it will be understood that this would also be done with the present fabrication process. After formation of the individual gate electrodes on the top surface of the wafer, individual OGST devices are isolated from all of the adjacent devices on the wafer by etching away the active GaAs layer around each device and its electrode, again through conventional techniques. For convenience, the present invention is described in terms of the construction of a single OGST device, or sample, having a gate, dual-drain electrodes placed symmetrically around the gate on the top surface of the active layer, and a source electrode on the bottom surface of the active layer, beneath the gate.

The drain electrodes, which are formed symmetrically around the gate, will perform in an improved manner if silicon is implanted into the drain area and the sample annealed to alleviate implant damage to the material and to activate donor impurities. Accordingly, a negative image of the drain area is masked for such implantation upon completion of the gate and isolation of the individual OGST devices. Thereafter, the substrate is thinned by lapping and polishing down to a thickness of about 0.003 inch.

The wafer is next mounted on an optically transparent sapphire or quartz disc by means of an optically transparent adhesive material to provide support for the thin film to be formed in the next etching step. The disc is secured to the top surface of the active layer, over the gate electrode.

A thin film etching mask is then formed on the lower surface of the substrate for use in removing, by a jet etching process, the semi-insulating GaAs substrate material in the region of the gate electrode so that the source electrode can be formed. Thereafter, the AlGaAs etch stop layer is selectively etched away in the same region, leaving a thin film of GaAs supporting the previously-formed gate electrode. This thin film is very fragile, so the next steps in the process are important, for the fewer times the free-standing membrane must be handled, the higher will be the yield of the process. The source electrode is formed on the lower surface of the GaAs thin film preferably by ultraviolet lithography, since this process postpones handling of the free standing membrane until after the source metallization has been completed. Such metallization provides support to the thin film, and as long as the membrane is supported, normal processing procedures can be used.

After completion of the etching process to form the thin film in the region of the gate electrode, a photoimageable polyimide layer is applied to the bottom surface of the sample and is exposed by means of a radiation source such as ultraviolet light from the top, or gate side, of the sample. The gate electrode serves as a mask for the exposure of the polyimide layer on the bottom surface. The light passes through the sapphire support disc, the adhesive material, the GaAs membrane and into the photoimageable material. The polyimide is then developed, leaving a source aperture directly opposite the gate. An ohmic contact material is then evaporated onto the bottom surface of the sample through the source aperture, coating the bottom surface of the active layer to form the desired ohmic contact for the source electrode. Thereafter, a diffusion barrier is evaporated onto the bottom surface to isolate the ohmic contact metallization from the plating material to be applied, and finally the plating material is deposited to form the surrounding ground plane. This ground plane metallization strengthens and supports the thin GaAs film, which can now be removed from the sapphire disc for continued handling of the wafer without destroying the thin film.

After removal of the sapphire support disc, drain contacts and transmission lines are fabricated symmetrically around both sides of the gate on the top surface of the active layer, using conventional ultraviolet photolithography. First, ohmic contact metallization is deposited onto the top surface of the GaAs thin film in the region of the drain implantations. Upon completion of this step, the source and drain contacts are formed by means of a rapid thermal alloying cycle which minimizes contact resistance of the source and drain electrodes, and makes a relatively shallow ohmic contact.

Optical lithography is generally preferred in the formation of semiconductor devices for many reasons, but is not usually capable of defining the very small dimensions that are required for millimeter wave devices because of the relatively long wavelength of the exposing radiation and because of scattering and diffraction effects in the semiconductor and resist materials. In the present invention, however, the thin film material has a resonant dielectric increase at the same frequency as the exposing radiation. The frequency of the radiation, which corresponds to a spectral line of the ultraviolet light source, must be of sufficient intensity to expose a photoimageable material on the second surface. The light passing by the edge of the top electrode, which forms the mask, is diffracted in the thin film material so that the light "spreads" as it passes through the thin film and into the resist to be exposed on the opposite surface. The amount of diffraction is normally a function of the wavelength of the impinging radiation relative to the dimension of the mask, but the diffraction effect is greatly reduced, in the present invention, by the use of a material which has a resonant dielectric increase which effectively reduces the wavelength of the light. The resonant dielectric characteristic of the material thus reduces the spreading of the light in the thin film, and improves the resolution available from optical lithography.

As an example of the foregoing effect, in ultraviolet lithography one would ordinarily use a wavelength of 300 to 450 nm (3,000–4,500 Angstroms) for exposing a resist material. Shorter wavelengths are seldom used because of the lack of sufficiently intense radiation sources, the lack of suitable non-absorbing materials for illuminating optics, and the lack of suitable photosensitive materials for such wavelengths. Known optical lithographic techniques have allowed the exposing light to define features which are about two wavelengths in size; that is, which are about 0.60 to 0.90 micron for ultraviolet light of the foregoing wavelengths. The prior art has been struggling to reduce the minimum dimension achievable with ultraviolet lithography to about 0.5 microns, but without real success. The present invention, on the other hand, enables optical lithography to have a very high resolution wherein features having a size of about 0.25 microns can be reproduced using ultraviolet light of the same order of wavelength that the prior art used. The present invention uses ultraviolet light having a wavelength of 436 nm in air. Most optical lithography systems can work efficiently at the G-line of the mercury spectrum, which is the envelope of radiation centered around 436 nm, and many commercial resist materials are optimized for this wavelength. However, such light has an effective wavelength of only 87 nm (870 Angstroms) when passing through a GaAs thin film, because of the resonant dielectric increase in the material at the incident wavelength, which increases the refractive index of the material. This reduction in the effective wavelength by a factor of five or more permits high-resolution reproduction of features in the 0.25 micron range and permits, in the fabrication of an OGST device, for example, the formation of a source electrode having a length of about one-half the length of a 500 nm gate electrode.

Although GaAs is generally thought to be opaque at ultraviolet frequencies, the use of a thin film, on the order of 200 nm thick, allows some transmission of light, and it has been found that sufficient radiation is transmitted at the peak resonant dielectric increase frequency to allow exposure of an ultraviolet sensitive photoimageable material on the opposite side of the substrate from the source of the exposing light. The success of the present procedure thus is highlighted by the fact that the wavelengths being used had been thought unsuitable in optical lithography for attaining the high resolution required for microwave devices, and by the further fact that it was thought that GaAs was too opaque to permit dual-surface optical exposure of resist materials.

An important implication of resonant dielectric lithography is that resolution less than ¼ of a micron is obtainable with mid-ultraviolet lithography, and the foregoing discussion sets out an important application of the technique. However, RDL can also be applied to both proximity and projection optical lithography either through the use of a thin solid film, as discussed above, or through the use of highly refractive fluids. Although fluids have previously been used to improve the resolution of lithography systems, the focus has been on reducing standing waves. One method of doing this is to apply an anti-reflection coating or light-absorbing medium between the photosensitive layer and the substrate. This reduces surface effects caused when the exposing radiation reflects from the substrate back into the photosensitive layer. The light absorbing medium may be either a quarter-wave plate or filter chosen to absorb light from the energy spectrum to which the photosensitive layer is sensitive. Another method of reducing standing waves is to match the refractive index of the medium in which the exposing radiation passes to the refractive index of the photosensitive layer. In accordance with the present invention, a fluid is inserted between the photomask and the photosensitive layer in a lithographic system. The fluid does not index match, but instead reduces the effective wavelength of the exposing radiation through the resonant dielectric increase effect. This also eliminates standing waves due to the absorption in the resonant substance.

The use of resonant dielectric techniques in proximity lithography increases resolution while solving defect problems associated with contact lithography. In this technique, a fluid or thin solid film is deposited between the photoresist and the mask. A fluid is preferred over a solid film because it is easier to deposit and remove. However, a solid film has the potential of providing greater resolution because of its higher potential refractive index, and may be advantageous for that reason. Typically, in promixity lithography there is a thin gap between the mask and the photoresist surface, typically on the order of 10 microns. This gap is provided to ensure that the mask and wafer do not come into contact with each other, but the provision of such a gap degrades the resolution by expanding the penumbrial region of the mask because of diffraction. A refractive fluid can be easily introduced between the mask and the photoresist, as by evacuating the gap and introducing the fluid at the edge of the interface between the mask and the photoresist. The dielectric fluid is chosen such that it does not significantly interfere with the chemistry of the photosensitive material, although it may introduce a change in the required exposure time and development time.

In projection lithography, lens elements in the object space are used to focus a mask image onto a substrate many centimeters away. Projection lithography generally has lower resolution than does contact lithography, although it provides lower defect densities and better registration. A resonant dielectric projection lithography system employs a resonant dielectric fluid or solid in the object space between the mask and substrate. Since the resolution of a projection lithography system is directly proportional to the wavelength of the incident radiation and inversely proportional to the numerical aperture of the optical system, the use of a resonant dielectric material will increase resolution in direct proportion to the refractive index of the medium in the object space and the sine of the semi-angle of the rays received by the object.

The implementation of RDL projection lithography is more difficult than RDL proximity lithography, for the dielectric fluid or solid would have to reside in the object space between the mask and the substrate, and in the case of a solid, would require part of the lens system to be embedded in the solid. Further, the wafer and mask would have to contact the solid intimately, with abrupt transitions. Accordingly, the best way of implementing RDL proximity lithography is to pump a dielectric fluid into and out of the object space.

The resonant dielectric lithography technique can also be applied to improving the resolution of optical microscopes. The numerical aperture of a microscope objective is a measure of both its light-gathering capability and its resolving power. The resolution of a microscope objective is inversely proportional to the wavelength of the incident radiation, and is directly proportional to its numerical aperture. The resolution is, therefore, directly proportional to the refractive index of the object space and the sine of the semi-angle of rays received by the object. The most obvious way of increasing the resolution of a microscope objective is to reduce the wavelength of the incident radiation. In theory, illuminating the object with 250 nm ultraviolet radiation would approximately double the resolving power of a microscope objective without changing the numerical aperture. However, in practice many substances which are virtually transparent to visible light exhibit strong absorption in the ultraviolet region. In addition, ultraviolet microscopes are expensive to make because fused quartz or quartz-fluoride objectives must be used, since glass absorbs strongly in the ultraviolet region.

The oil immersion microscope has long used the non-resonant dielectric properties of fluids to increase resolution. In practice, the object space between the object and the lower surface of the first component of the objective is filled with a refractive fluid. Resolution increases in proportion to the refractive index of the fluid in two ways. Firstly, the refractive fluid reduces the effective wavelength of the radiation between the object and the first element of the objective, reducing diffractive effects. Secondly, the refractive fluid decreases the angular divergence in the object space and, therefore, the objective admits a wider cone of rays, thereby increasing the resolution by the sine of the angular increase. In addition, by matching the index of the fluid to the index of the objective lens, the object becomes optically embedded into the objective. By adjusting the position of the objective, the object may be brought into an aplanatic point. The resulting image is free from monochromatic spherical aberration and coma associated with the first element of the objective lens. Cedarwood oil has approximately the same refractive index as glass and, therefore, is commonly used for this purpose.

Numerical apertures as high as 1.4 have been attained with the above technique. The use of highly refractive fluids not index-matched to the objective has led to immersion objectives with numerical apertures as high as 1.6. Utilizing a refractive material with a resonant dielectric increase at the same energy as the observing radiation significantly increases the numerical aperture and, therefore, the resolution. Accordingly, a refractive fluid or thin solid film is deposited in the objective space. This film or fluid is chosen to have a resonant dielectric increase at the same energy as a practical monochromatic optical illuminating source. A monochromatic source is used, since chromatic aberrations would be especially severe because of the large dispersion in a resonant medium. A short wavelength monochromatic optical source will maximize the resolution. Although a dielectric solid film potentially provides a higher refractive index, it is much more difficult to implement, and accordingly a dielectric fluid is preferred.

The resonant refractive fluid which is deposited between the object and the first element of the objective reduces the effective wavelength of the examining radiation and the angular divergence of the rays without introducing monochromatic aberrations. This provides a higher numerical aperture and, therefore, increases the resolving power.

BRIEF DESCRIPTION OF THE DRAWINGS

The foregoing, and additional objects, features and advantages of the present invention will become apparent to those of skill in the art from a consideration of the following detailed description of preferred embodiments thereof, taken in conjunction with the accompanying drawings, in which:

FIGS. 9-17 diagrammatically illustrate the fabrication of an OGST device using the dual-surface lithography process of the present invention.

DESCRIPTION OF PREFERRED EMBODIMENTS

Figure 1:
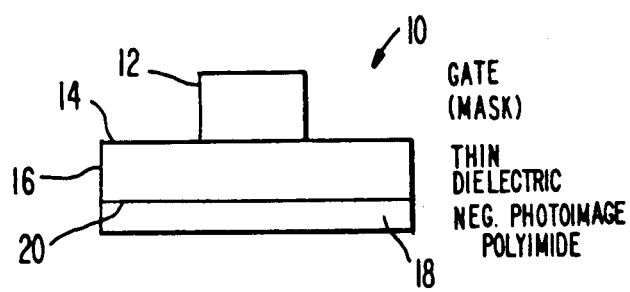
FIGS. 1-4 diagrammatically illustrate the high optical resolution produced by resonant dielectric lithography.

Turning now to a more detailed consideration of the present invention, FIGS. 1 through 5 illustrate the application of resonant dielectric techniques to dual-surface lithography. This technique, as indicated above, utilizes a resonant dielectric increase in the medium situated between a mask and a photosensitive layer to increase the resolution of the pattern produced in the photosensitive layer by the mask. The resonant medium reduces the effective wavelength of the exposing radiation, eliminates standing wave patterns, and self-collimates the radiation. Resonant dielectric lithography permits definition of patterns with dimensions and alignment precision less than one-half the wavelength of the incident radiation and, in addition, finds particular application in semiconductor manufacturing processes where it permits achievement of precise relative dimensional control of two opposing self-aligned electrodes. This application is illustrated in FIGS. 1 through 5, wherein a semiconducting device 10 includes an electrode 12 which is fabricated conventionally on the top surface of a thin substrate 14. The electrode 12 serves as a contact to one surface of the substrate, and also serves as a conformal mask for the lithography on the opposing surface of the substrate. A photosensitive material 18, sensitive to the same energy that produces a resonant dielectric increase in the substrate, is applied to the bottom surface of the thin substrate 16.

Figure 2:
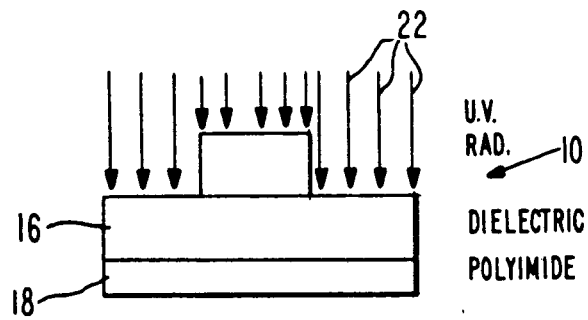

As diagrammatically illustrated in FIG. 2, the top surface of the semiconductor device 10 is exposed to radiation, illustrated by arrows 22, which has an energy that is matched to a resonant dielectric peak in the substrate. The radiation passes through the substrate 16 and activates the photosensitive layer 18 with the energy of the incident radiation, again as illustrated in FIG. 2. The photosensitive material is then developed to produce an image 24 (see FIG. 4) which has extremely high resolution and is self-aligned to the previously fabricated electrode 12 on the top surface of the substrate. Extremely high resolution occurs for several reasons. First, the intimate contact between the electrode 12, or mask, and the substrate 16 together with the large reduction in the effective wave length of the radiation within the substrate greatly reduces edge diffraction. Secondly, the absorption within the substrate eliminates standing wave patterns. Finally, the increase in the refractive index self-collimates the radiation, effectively reducing the dimension of the conformal mask. An advantage of this arrangement is that the diffraction effects can be utilized to achieve varying relative dimensions of the image with respect to the mask.

The primary limitation on the resolution available through shadow printing is the diffraction of light at the edge of the mask. The minimum transferrable period is given by:

$$2b_{min} = 3\sqrt{\lambda_{eff}\left(g + \frac{d}{2}\right)} \approx 3\sqrt{g\lambda_{eff}} \quad \text{(Eq. 1)}$$

where $2b$ is the grating period, $\lambda_{eff}$ is the effective wavelength of the exposing radiation, g is the gap width maintained between the mask and the photosensitive layer, and d is the photoresist thickness. Resolution, therefore, has a one-half order dependence on the gap width and the effective wavelength in the image space. The gap width of shadow printing systems is limited by debris from the resist coating and mask emulsion, particles from the environment, and flatness of the mask and substrate, among other things. Such defects destroy both the pattern and the mask. Proximity lithography solves these problems by using a gap width large enough to completely separate the mask and the photosensitive layer, and in practice ten microns is the smallest gap that can be used in order to ensure that the mask and wafer never come in contact with each other. Self-aligned, dual-surface lithography, in accordance with the present invention, eliminates misalignment errors and can provide a uniform, consistent gap width on the order of 0.2 to 0.3 microns.

Figure 3:
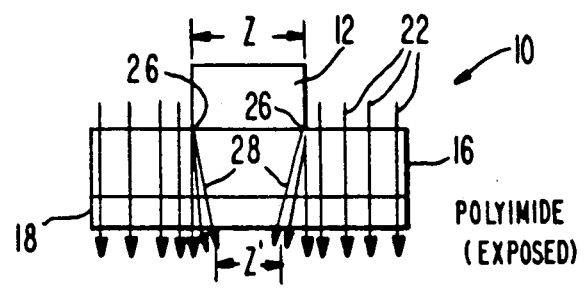
Figure 4:
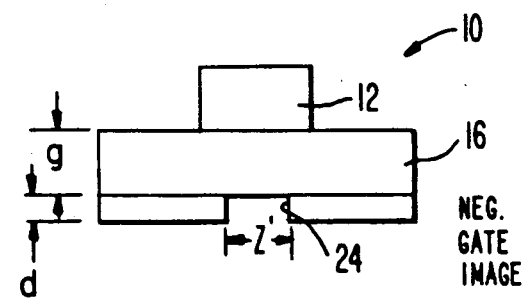
Figure 5:
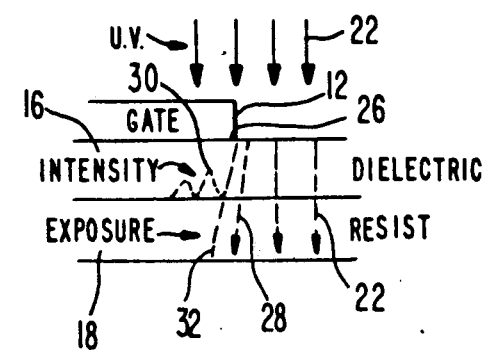
FIG. 5 illustrates the diffraction effects within the thin-film active layer.

The free space wavelength of light $\lambda_0$, used in past photolithography systems has generally been limited to 200 nm. Most optical lithography systems use high pressure discharge sources which do not emit intense radiation below 300 nm. In addition, optical glass absorbs strongly below 350 nm and any attempt to use a shorter wavelength would require the use of more expensive quartz optics. Finally, most photoresists have an optical density greater than 1 for energies corresponding to free space wavelengths less than 300 nm so that most of the incident radiation for shorter wavelengths would be absorbed near the surface of the resist. Resonant dielectric lithography in accordance with the present invention, on the other hand, utilizes a dielectric resonance in the medium between the mask 12 and the photosensitive layer 18 which results in a greatly increased refractive index when the energy of the exposing radiation is matched to the energy of the resonant dielectric increase. By matching these energies, the effective wavelength of the exposing radiation can be reduced by as much as a factor of 5. Edge diffraction, therefore, takes place in a region of high refractive index, thereby dramatically increasing the resolution. As illustrated in FIGS. 3 and 5, edge diffraction occurs at the edges 26 of the conformal mask 12, where the mask meets the upper surface 14 of the dielectric layer 16. At these edges, the incident radiation, indicated by arrows 22, not only passes straight through the dielectric layer, but a portion is diffracted inwardly, as indicated by the arrows 28 in FIG. 3 and FIG. 5.

The incident radiation 22 is collimated by a suitable optical system to effectively locate the radiation source at infinity. The radiation passes by the edge 26 of the gate 12, or any other masking element, and as it enters the dielectric layer or substrate 16, it is diffracted inwardly in a pattern illustrated by the intensity distribution curve 30. As shown by this curve, the intensity of the diffracted light diminishes with distance inwardly under the edge 26 of gate 12. The lessened intensity is less able to expose the photosensitive material 18. Accordingly, for a selected time period of exposure, with a selected intensity level of the incident ultraviolet light, the exposure of the photosensitive material follows a selected exposure boundary indicated by line 32 in FIG. 5. By carefully controlling the intensity of the exposure and the time for which the photosensitive material is exposed, the degree of undercut of exposure, or the angle away from the vertical of the boundary 32, can be controlled. This angle of the exposure boundary and the thickness d of the photosensitive layer determines the length 1' (FIG. 3) of the negative gate image 24 with respect to the length 1 of the mask 12.

The shape of the diffraction intensity pattern 30 is a function of the wavelength of the impinging light, so that the longer the wavelength, the greater will be the diffraction of the light. Accordingly, for longer wavelengths of exposing light, the diffracted radiation will extend further under the edge of the mask. Such variations of intensity in the diffraction pattern effectively grade the edge boundary of the resist image. It has been found, however, in accordance with the present invention, that in thin film materials having a resonant dielectric increase at a frequency, or wavelength, corresponding to the wavelength of the impining light, the diffraction effects are significantly reduced, because the effective wavelength is reduced. Such a reduction in the effective wavelength thus permits a more accurate, higher resolution reproduction of the pattern of the gate 12 in the photosensitive material, and permits formation of a gate image 24 which is smaller than the mask 12, and is much smaller than would be expected with ultraviolet light of the wavelength being provided by the light source.

The effective wavelength of the exposing radiation is given by:

$$\lambda_{eff} = \frac{\lambda_o}{n} = \frac{c}{nf} = \frac{v}{f} \quad \text{(Eq. 2)}$$

where $\lambda_0$ is the free space wavelength, n is the refractive index in the object space, c is the speed of light, f is the frequency of the radiation, and v is the velocity of radiation in the medium. Increasing the refractive index of the medium through which the radiation passes reduces both the velocity and the effective wavelength of the radiation in linear proportion. However, the frequency, and therefore the energy of the radiation, remains constant. The photosensitizer material is sensitive to the energy of the radiation. Hence, reducing the effective wavelength of the exposing radiation has no effect on the performance of the photosensitive material, although it does reduce diffraction.

Figure 6:
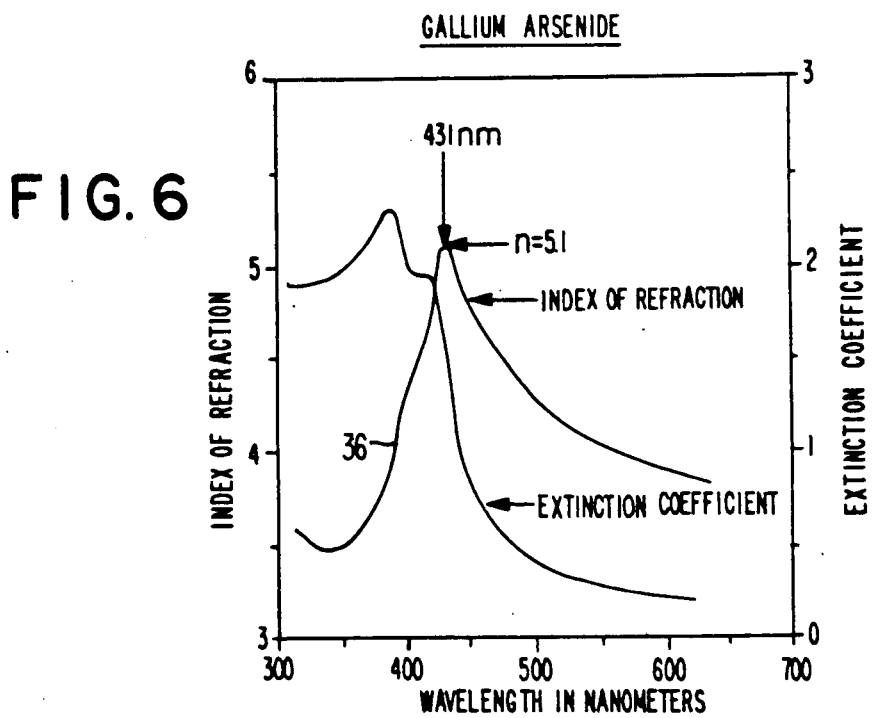
FIG. 6 is a diagram of the relationship between the refractive index, the extinction coefficient, and the energy of impinging light for Gallium Arsenide.

Gallium Arsenide (GaAs) is ideally suited for dual surface resonant dielectric lithography. FIG. 6 illustrates the energy dependence of the dielectric constant and the absorption of the material, by showing the refractive index and the extinction coefficient of GaAs as a function of energy. The refractive index is the square root of the dielectric constant and the extinction coefficient is directly proportional to the absorption coefficient of the material. As illustrated by curve 36, the refractive index of GaAs peaks at 5.1 at an energy level of 431 nm (2.88 ev). Therefore, when incident radiation of 431 nm propagates into a thin GaAs substrate such as the substrate 16, the effective wavelength within the medium reduces to 86 nm. This represents a 510% reduction in effective wavelength, and consequently a 226% increase in resolution. The peak of the refractive index occurs at an especially convenient energy since most optical lithography systems can work efficiently at the g-line of the mercury spectrum which is the envelope of radiation centered around 436 nm (2.85 ev). Consequently, many commercial photosensitive materials are optimized for 436 nm radiation and, therefore, are extremely sensitive at the frequency corresponding to the peak refractive index of GaAs.

Figure 7:
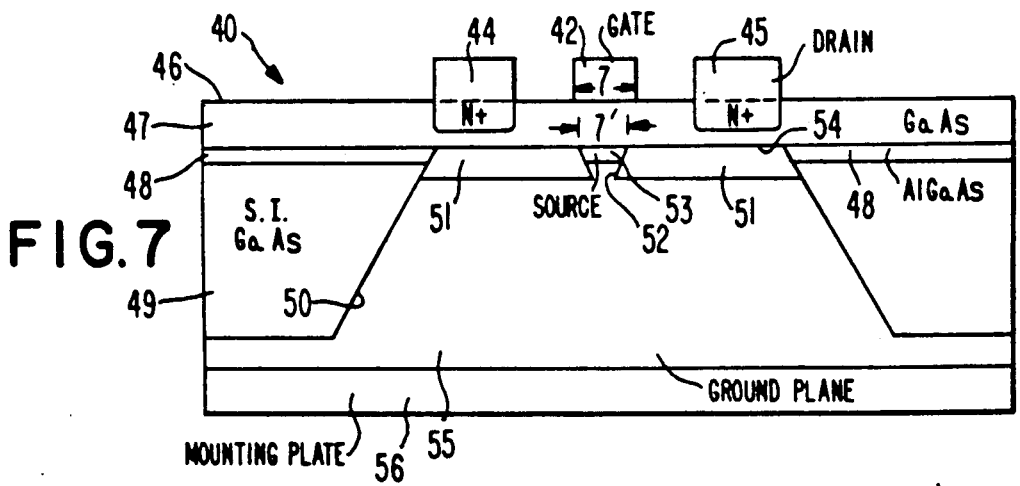
FIG. 7 is a diagrammatic illustration of an OGST device constructed in accordance with the method of the present invention.

As indicated above, an important application of resonant dielectric lithography lies in the use of this technique to fabricate electrodes of varying relative lengths on opposing surfaces of a thin substrate, and particularly to produce a source electrode opposite to and aligned with a gate electrode in OGST devices and in other transistors. An example of such an application is illustrated in FIG. 7, which is a diagrammatic cross-sectional view of an OGST device 40 having a gate electrode 42 having a length 1 of about 500 nm, and flanked by a symmetrical pair of drain electrodes 44 and 45. All of these electrodes are located on the upper surface 46 of a semiconductor active layer 47, which preferably is a GaAs thin film having a thickness on the order of 200 nm. The thin film layer 47 is located on an intermediate etch-stop layer 48 of AlGaAs which has a thickness on the order of 100 nm, and is supported by a semi-insulating GaAs substrate 49. A central aperture 50 is formed in the substrate 49, below the gate electrode 42, and a layer 51 of a photoimageable material such as polyimide is placed in the aperture 50. The layer 51 is exposed, developed and cured using resonant dielectric lithography to produce a source opening 52 in which a source electrode 53 is produced. This electrode is aligned directly opposite the gate electrode 42, on the lower surface 54 of the GaAs active layer 47, and has a length 1'. A metallized ground plane 55 provides a contact with the source electrode, or may itself form the electrode, and covers the bottom surface of the OGST device 40. The device preferably is mounted on a suitable mounting plate 56 for handling the completed transistor.

OGST structures provide numerous advantages, as described above, including integrated input and output transmission lines, with the drain-source output lines being impedance and phase matched to the gate-source input line. This structure allows the output power to add coherently along the transmission lines so that power adds as the square of the gate width and also has the advantage of reduced source resistance and inductance. Further, the structure reduces the effective gate length and effectively doubles the transconductance of the transistor. Also, transmission line losses are minimized.

Figure 8:
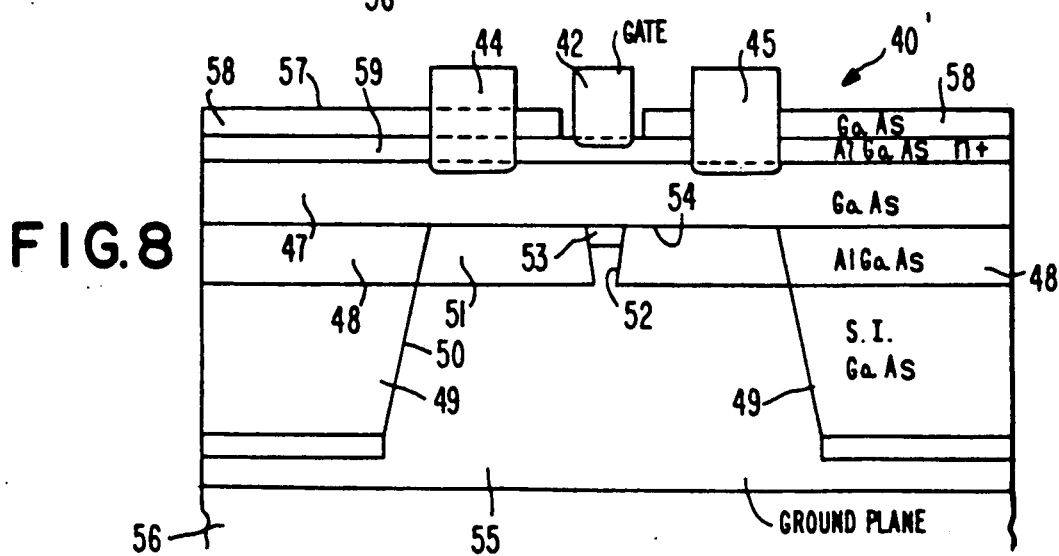
FIG. 8 is a diagrammatic illustration of a heterojunction OGST device with a high electron mobility structure incorporated.

The OGST device can also be constructed to incorporate a high electron mobility structure to form a heterojunction opposed gate-source transistor (HOGST) device 40', illustrated in FIG. 8. This device is similar to the OGST device of FIG. 1, and similar elements of the structure are identified by the same numbers; however, the HOGST device includes additional semiconductor layers. The HOGST device is fabricated in essentially the same manner as the OGST, through the use of dualsurface resonant dielectric lithography. In the HOGST device, a recessed gate electrode 42 is formed in the upper surface 57 of an active GaAs layer 58. The gate 42 is flanked by a pair of drain electrodes 44 and 45. The GaAs layer 58 is formed on an $Al_yGa_{1-y}As$ layer 59 which, in turn, is formed on an undoped GaAs layer 47. The layer 47 is formed on the top surface of an undoped $Al_yGa_{1-y}As$ layer 48 carried by a semi-insulating GaAs substrate 49. An aperture 50 is formed in the semi-insulating substrate 49 and extends through layer 48. Aperture 50 receives a layer 51 of photoimageable material in which is formed the source opening 52. The source electrode 53 is connected to a metallized ground plane 55 which fills aperture 50, and which covers the bottom of the HOGST device. The device may be mounted on a mounting plate 56.

Although the HOGST device 40' is illustrated as being fabricated from GaAs and AlGaAs materials, the heterojunction transistor is not limited to this material system. For example, the layers 58, 59, 47 and 48 may be fabricated from $Ga_xIn_{1-x}As$; $Al_yIn_{1-y}As$; $Ga_xIn_{1-x}As$; and $Al_yIn_{1-y}As$, respectively. This material system would further improve the high frequency performance of the HOGST device. Also, the device may be pseudomorphic, wherein the different heterojunction materials are not lattice matched.

The resonant dielectric method of fabricating the two devices illustrated in FIGS. 7 and 8, as well as other devices which require accurate positioning of device elements on opposite surfaces of a thin film or other similar layer with a high degree of resolution, is illustrated in FIGS. 9–17. The illustrated process utilizes the resonant dielectric properties of an active thin film semiconductor layer to reduce the effective wavelength of an exposing ultraviolet radiation to thereby produce self-aligned electrode elements and to achieve a higher degree of alignment accuracy and shape resolution than was previously thought possible. The process also takes advantage of the fact that in the OGST structure, or similar dual-surface electrode structures on thin semiconductor films, the gate electrode on the top surface of the film, which serves as a mask for the formation of the source electrode, is less than 300 nm away from the resist material on the bottom surface of the thin film membrane. In other lithographic techniques, uniform gap widths this small are difficult to achieve in practice. As a result of this structure, edge diffraction of the incident radiation is reduced in the fabrication of the OGST device.

GaAs thin films in the range of 200 nm to 300 nm thick have been considered to be opaque to the ultraviolet light used to expose resist materials. However, as shown in FIG. 6, the absorption characteristic, or extinction coefficient, of GaAs exhibits a transition from a relatively low opacity to a relatively high opacity in the wavelength range from 450–400 nm. This transition region encompasses the frequency at which the resonant dielectric peak or refractive index peak occurs in the GaAs material. The absorption of energy from the incident radiation in this region causes the resonant dielectric increase, although the peak absorption occurs at different frequencies. The absorption eliminates standing waves in the thin film, but increases the energy required to expose the photoimageable material, so it is desirable to have the frequency of peak dielectric increase different than the peak absorption.

The region of peak dielectric resonance coincides with the spectral G-line of the mercury spectrum, a relatively intense peak. Because it is off the peak absorption frequency, there is sufficient transparency to light at this wavelength to enable an ultraviolet source to expose a resist material through a GaAs thin film. As shown in FIG. 6, the GaAs material exhibits a high index of refraction at this wavelength, which serves to reduce the diffraction effect on the light as it travels into and through the thin film. The reduction in wavelength is the inverse of the index of refraction, so that in a GaAs film having an index of refraction of 5, the effective wavelength of the incident radiation would be reduced by 1/5, or from 436 nm in air, to 87 nm in GaAs. This reduced effective wavelength improves mask edge resolution substantially, and thereby permits reliable fabrication of elements having features on the order of 0.25 micron. Dual-surface lithography using this technique is now possible, enabling reliable fabrication of OGST devices for extremely high frequency applications.

The starting material used in the fabrication of an OGST device is typically gallium arsenide; however, other semiconductor materials can be used with appropriate, but minor, process modifications. The material used in the preferred form of the invention shown in FIG. 9 consists of a semi-insulating GaAs substrate such as that illustrated at 49 in FIG. 7. An AlGaAs etch stop layer 48 is formed on the top surface of substrate 49, and an n-type GaAs epitaxial active layer 47 is grown on the top surface of layer 48. The present fabrication process is generally independent of the material used for the substrate 49, as long as it carries an etch stop layer such as that illustrated at 48, allowing a wide variety of devices, including vertical HOGST and vertical pseudomorphic HOGST transistor devices, to be fabricated with this process. Only the dual-surface lithography exposure parameters, and possibly the source drain alloy cycle and the gate electrode fabrication, needs to be modified from the process here illustrated when other device structures are made. Although the principle of device operation is different with different structures such as HOGST devices, the fabrication process is very similar. The substrate 49 and layers 48 and 47 form a wafer on which a large number of devices may be fabricated.

One or more high aspect ratio tungsten gate electrodes 42 are fabricated on the upper surface of the GaAs active layer 47 by conventional electron-beam lithography and reactive ion etching (RIE). Such gates may be formed with dimensions of between 0.15 and 0.50 micron in length and greater than 1 micron in height, and this can be achieved with insignificant undercut. In such a process, for example, a tungsten layer 70 is first deposited, as by sputtering, on the top surface of the active layer 47, as illustrated by the arrows 72, preferably to a depth of 1 micrometer. Positive gate images are formed on the tungsten layer 70 as by direct write electron-beam lithography, in which a resist layer is deposited on the top surface of the tungsten layer 70. The resist layer is exposed by the electron beam and developed, and an etch mask 73 is formed by the evaporation of nickel or aluminum on the developed resist and then lifting off the resist. Thereafter, the negative image of the tungsten gate is etched away, with etching occurring on the unmasked areas, by reactive ion etching (RIE), indicated by arrows 74, using low pressure, low power CF4 plasma. This technique results in the production of the gate 12 indicated in FIG. 4. By using very low power densities in the RIE step, high aspect tungsten structures with insignificant undercut are fabricated.

As previously indicated, the OGST devices of the present invention typically are formed in a 7 by 7 array on a single wafer. Following the formation of a gate 42 for each device, individual devices are isolated by etching away the active layer 47 by conventional mesa lithography. Each individual device is optically patterned using ultraviolet light to form negative images of the device mesas in a conventional photoresist material. The photoresist pattern is then hard baked, and the mesa is etched down to the semi-insulating substrate 49 using an etching solution of $H_2O_2:H_3PO_4:H_2O$. This produces an array of individual elements, or samples, such as that illustrated at 75 in FIG. 11, on the substrate 49, with each sample including an etch stop layer 48 and an active layer 47, with a generally centrally located gate 42. The isolated samples, all remain on the substrate 49, but the active layers are separated in this manner to form individual devices. For convenience, only a single sample 75 is illustrated herein.

Drain implantation improves the drain electrode ohmic contact, so the next step in the process is to form a negative image of the drain areas by means of a suitable mask 76, as illustrated in FIG. 11. Silicon is implanted through the mask 76 into the drain areas, as illustrated by the arrows 78. The sample is then annealed to reduce the damage and to activate the donor impurities. The silicon implantation is indicated at areas 80 and 82 in the regions of the drain electrodes, which are to be formed in a later step of the process. The mask 76 is then removed.

Thereafter, and as further illustrated in FIG. 11, the substrate 49 is lapped and chemically polished to surface 83 giving a thickness of about 3 mils. This removal of the bulk of the semi-insulating substrate layer 49 greatly improves the uniformity of the later etching steps. The wafer layer 49 is first lapped to a thickness of ten mils, and is then polish etched to 3 mils, using bromine-methanol pressure etching. The semi-insulating substrate 49 serves as the dielectric for the gate-source and the drain-source microstrip input and output transmission line. Therefore, the thickness of the semi-insulating substrate is tailored to match the characteristic impedance of the gate and drain electrodes.

The next step of the fabrication process involves the formation of an etching mask on the bottom surface of semi-insulating substrate 49. The mask is aligned to the gate electrode on the upper layer. The etch mask, illustrated at 84 in FIG. 12, allows a very accurate exposure of the thin film 47 in the region below the gate electrode 12. The etch mask 84 is fabricated on the bottom surface of the semi-insulating substrate 49, so that an aperture can be formed below the gate electrode 42 already formed on the upper surface. The mask 84 may be fabricated out of nickel or of some other suitable material such as Dupont Pyralin P12555 Polyimide. Nickel is preferred, since a very thin layer can be used so that overhanging areas are easily broken away and removed during the etching process. Furthermore, nickel improves wetting of the alloyed Au-Ge ground plane material to be formed in a later step. Additionally, nickel appears to have the effect of improving etch uniformity and the anisotropy at the etch stop layer 48. Both materials, however, yield exceptionally uniform thin film active layers.

In a preferred form of the invention, an optical mask is aligned through the semi-insulating substrate 49 with the gate electrode 42 on the top surface of sample 75, using an infra-red aligner. A resist layer is then optically patterned using ultraviolet radiation to form the negative image of etch mask 84 on the semi-insulating substrate, using conventional lithography techniques. Thereafter, the masking material 84 is evaporated onto the bottom of the substrate layer 49 and the resist material within the mask opening 86 is lifted off the sample to define the area of the substrate where the thin film of the device is to be exposed for connection to the source electrode.

After formation of the etching mask 84, the sample 75 is mounted on a sapphire disc, illustrated at 90 in FIG. 13, by means of a suitable adhesive such as Aremco Crystalbond No. 509, which is a clear adhesive transparent to mid UV radiation. The sapphire disc 90 provides support for the sample and for the thin film to be exposed.

The semi-insulating substrate 49 is then selectively etched down to the AlGaAs stop layer 48 through mask opening 86. A jet etching technique using a solution of $H_2O_2:NH_4OH$ at an etch concentration which maximizes selectivity so that the etching stops at the AlGaAs stop layer 48, is preferred. The concentration should also maximize surface uniformity, and it has been found that an optimum mixture is a 25 to 1 ratio of a 30% solution of $H_2O_2$ and $NH_4OH$ adjusted to a pH of 8.4. This etch was successfully used with aluminum concentrations in the etch stop layer 48 in the range of 0.3 to 0.5.

Jet etching of the substrate material 49 through mask 84 is illustrated in FIG. 13 by the arrows 94, whereby the first part of source aperture 50 is formed in substrate 49, as also shown in FIG. 7. Thereafter, the AlGaAs etch stop layer 49 is itself etched selectively, through the use of HF at 80° to form the remainder of the source aperture 50, as illustrated by the arrows 96 in FIG. 14. This procedure reveals the thin film active layer 47 within the source aperture 50, and yields a thin film of exceptional uniformity. The next step in the process is to define an image of the gate electrode 42, centered under, and approximately one half of, the length of the gate, but on the opposite side of the active layer 48 from the gate location. The formation of this image through the use of ultraviolet lithography from the gate side of the sample has the advantage of postponing the first handling of the sample with an exposed, free-standing membrane until after the source metallization has been completed. As long as the membrane is supported by an appropriate polymer or wax medium, and mounted on the sapphire disc 90, normal processing procedures can be used.

In accordance with the technique of the present invention, the gate 42 is used as a mask for exposure of a photosensitive material by the ultraviolet light source indicated in FIG. 15 by the arrows 100. The light source produces collimated light which passes downwardly through the sapphire disc 90, through the adhesive layer 92, through the active layer 47, and into a photoimageable polyimide layer 102 which is spun onto the bottom surface of the active layer 47 through the source aperture 50. The photosensitive layer 102 may be a material such as Ciba-Geigy Probimide 337 photoimageable polyimide. The ultraviolet light passing by the gate 42 forms an image 104, illustrated in FIG. 15, corresponding to the shadow of the gate electrode 42. The polyimide layer 102 is then developed to fix the source image, and is cured to thereby produce the source aperture 52 illustrated in FIG. 7 and in FIG. 16. The polyimide material remaining on the bottom surface of the active layer is illustrated at 51 in FIGS. 7 and 16, and serves as the drain-source dielectric for the device.

In order to insure that the source makes contact with the ground plane, the thickness of the polyimide should not be greater than the length l of the gate; i.e., the aspect ratio of the source image 104 should not exceed one.

The next several steps in the process involve the evaporation of a source contact onto the bottom surfce of the active layer 47 through the source aperture 52, and the formation of a ground plane which is plated onto the bottom of the device to reduce parasitics and to safely support the thin film. The first step is to provide an ohmic contact for the source electrode. This is done by depositing a Au-Ge ohmic contact metallization layer 110 which, as illustrated in FIG. 16, covers the nickel etch mask 84, the polyimide material 51, and the bottom surface of the active layer 47 where it is uncovered by the source aperture 52. The Au-Ge alloy layer must be nickel-free because nickel produces spikes which could potentially short circuit the gate and source electrodes.

Thereafter, an Ag or Ti diffusion barrier 112 is evaporated onto the bottom surface of the device, as illustrated in FIG. 16. This diffusion barrier serves to isolate the ohmic contact metallization previously applied in layer 110 from the plating material to follow. Following the application of the diffusion barrier, an Au plating base layer 114 is evaporated onto the bottom surface of layer 112. Thereafter, the ground plane 116 is plated onto the bottom layer of the device, and the device is secured to a mounting plate 118 with the gate electrode 42 facing upwardly. The adhesive layer 92 may then be dissolved in acetone to remove the sapphire disc 90 and to thereby uncover the top surface of the active layer 47 and the gate 42.

The drain contacts and the transmission lines for connecting the device to an exterior circuit are then fabricated symmetrically around both sides of the gate electrode 42 on the top surface of the active layer 47, as illustrated in FIG. 17. This is done by a conventional lift off technique using conventional ultraviolet photolithography. Thus, the upper surface of layer 47 is provided with a coating of a suitable photoresist material, and a positive drain image is aligned with the gate electrode to position the drains symmetrically on either side thereof. Thereafter, an ultraviolet light source is directed through the mask to expose a positive image of the drain electrodes in the resist material 122. After developing the resist material 122, an Au-Ge alloy layer is evaporated onto the upper surface of the device to form the drain ohmic contacts 44 and 45, as illustrated in FIG. 11. The evaporation of the Au-Ge alloy is indicated by the arrows 128. Thereafter, the resist material 122 remaining on the surface of the active layer is lifted off, leaving the device illustrated in FIG. 7.

The source and dual drain contacts 44, 45 and 53 are formed with a rapid thermal alloying cycle to minimize penetration of the active layer and to make a relatively shallow ohmic contact. The alloying cycle producing the best results includes the steps of baking the sample for ten seconds at 300° C. to remove water vapor and minor surface contaminants that may evaporate and damage the thin membrane. Thereafter, the material is alloyed at a eutectic temperature of 375° C. for 10 seconds. This helps to break up the interface oxides and improves surface wetting. Finally, the material is alloyed at 450° C. for ten to 60 seconds, with 30 seconds generally being sufficient.

Although the techniques illustrated in FIGS. 9-17 are particularly directed to the OGST device of FIG. 7, the steps involving dual-surface lithography are also useful in forming other devices, such as the device of FIG. 8. However, the details of the other steps used in forming such a device need not be here described, but will be apparent to those of skill in the art.

Resonant dielectric lithography has achieved dimensions below one-quarter micron, using standard mid-UV optical lithography equipment and chemicals, thus making practical the fabrication of OGST structures having the dimensions required for millimeter wave operation. This technique has wide application in the fabrication of other high-speed electronic and optical devices; in addition, the technique can be extended to planar lithography and to microscopy. In resonant dielectric planar lithography, a fluid or thin solid film resonant at or near the energy of the incident radiation, is deposited between a photosensitive layer and a mask to increase the resolution in the same manner discussed above. In a resonant dielectric microscope, a fluid or thin solid film resonant at or near the energy of the observing radiation is deposited between the object being viewed and the first element of the objective lens. This greatly increases the numerical aperture of the microscope and therefore its resolving power. This occurs because of the reduction of the effective wavelength of the light between the object and the first element of the objective, and the consequent reduction in diffraction. In addition, the refractive fluid increases the angular divergence of light in the object space to admit a wider cone of rays, increasing the resolution by the sine of the angular increase.

Figure 18:
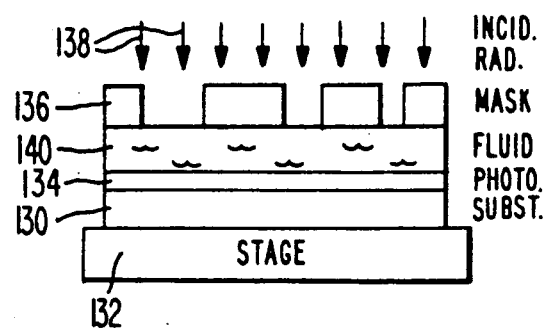
FIG. 18 is a diagrammatic illustration of a proximity lithography technique.

FIG. 18 illustrates in diagrammatic form the use of resonant dielectric lithography in proximity lithography. In this system, a substrate 130 is mounted on a support stage 132, and a photoresistive layer 134 is spun onto the top surface of the substrate. A mask 136 is positioned over the photoresistive layer leaving a small gap of about 10 microns between the bottom of the mask and the top surface of layer 134 to make sure the two do not come into contact. Such a gap degrades the resolution of this type of lithography by expanding the penumbral region caused by diffraction of the incident radiation 138. In accordance with the present invention, resolution is increased by depositing a film 140 between the mask 136 and the photoresist layer 134. The film has a high refractive index and a resonant dielectric increase at the frequency of the exposing incident radiation, thereby reducing the diffraction of light between the mask 136 and the resist layer 134. Although a fluid is preferred for the film layer 140 because it is easier to deposit and to remove, a solid film will provide greater resolution because a higher refractive index can be obtained. A refractive fluid can easily be introduced between the mask 136 and the photoresist 134, for example, by first evacuating the gap between these layers and then introducing the fluid at the edges. Very consistent gap spacing can be achieved by keeping the pressure in the gap constant, and introducing the precise amount of fluid. Care must be taken to select a fluid which will not interfere with the chemistry of the photoresist layer.

Figure 19:
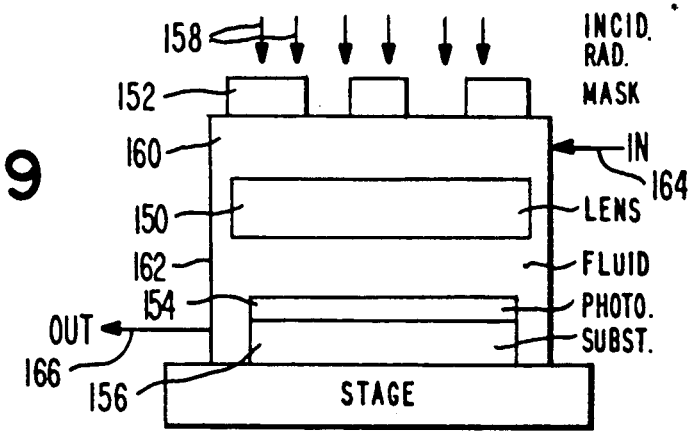
FIG. 19 is a diagrammatic illustration of a projection lithography technique.

In projection lithography, illustrated in FIG. 19, lens elements 150 in the object space are used to focus the mask image 152 onto a photoresist layer 154 on a substrate 156 many millimeters away. The resolution of such a system is directly proportional to the wavelength of the incident radiation 158 and inversely proportional to the numerical aperture of the optical system. The resolution can be improved by employing a resonant dielectric fluid or solid in the object space between the mask and the substrate. The resolution increases in such a system in direct proportion to the refractive index of the medium in the object space and by the sine of the semi-angle of the rays received by the photoresist layer.

In a projection lithography system, a solid dielectric is difficult to implement, because the lens must be embedded in the solid. Further, the mask and the photoresist would contact the solid intimately, with abrupt transitions. Accordingly, it is preferred to fill the object space with a fluid 160 having a resonant dielectric increase at the energy of the incident light. The fluid 160 is contained within a housing 162 in which the wafer, including the substrate 156 and the photoresist 154, is placed. The fluid is pumped through the housing via inlet 164 and outlet 166 to wash away impurities and to maintain a precise temperature at the wafer.

Figure 20:
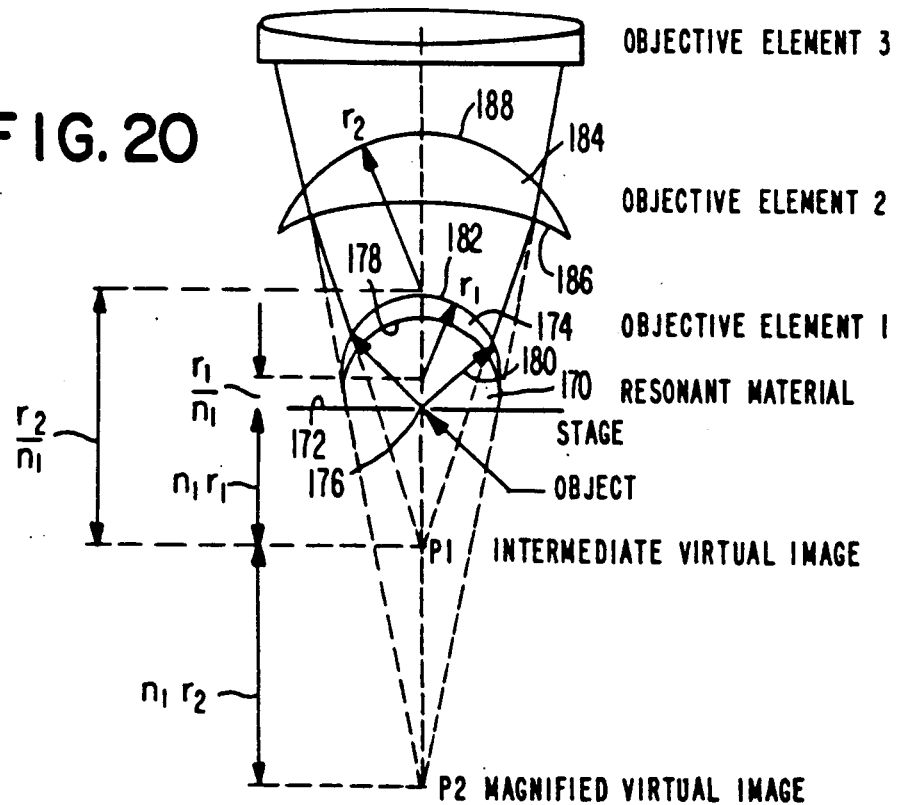
FIG. 20 is a diagrammatic illustration of an optical microscope using resonant dielectric lithography.

As illustrated in FIG. 20, the resonant dielectric lithography technique can also be used to improve the resolution of optical microscopes. A refractive material 170 which may be a fluid or a thin solid film, is deposited in the object space between the stage 172 and the first objective lens element 174. The material 170 is chosen to have a resonant dielectric increase at the same energy as a practical monochromatic optical illuminating source. A monochromatic source must be used because chromatic aberrations would be severe due to large dispersion in the resonant medium. A short wavelength optical source is preferred to maximize resolution.

A resonant dielectric microscope can also minimize the spherical aberration and coma usually associated with the objective lens. However, the design is more complex, because the index of the dielectric medium does not match the index of the lens. Consequently, the object 176 on stage 172 can no longer be optically embedded into a plano-convex lens. However, Abbe's sine condition can still be met if a thin meniscus lens is used instead of a plano-convex lens for the first element 174 of the objective. The space between the object 176 and the first element 174 of the objective is filled with the resonant dielectric fluid 170. The front surface 178 of the first meniscus lens 174 has its center of curvature at the object. Therefore, rays 180 from the object enter the lens without deviation, thereby optically "embedding" the object into the lens. Therefore, refraction does not occur until the second surface of the lens. The rear surface 182 of the first meniscus lens is designed so that its center of curvature is a distance r1/n1 from the object where n1 is the refractive index of the lens, and r1 is the radius of the rear surface of the first element. This makes the object an aplanatic point with respect to the intermediate virtual image point P1.

The resulting intermediate virtual image is a distance n1r1 from the object. With this design a higher numerical aperture can be employed by increasing the refractive index in the object space and reducing the angular divergence of the rays without an introduction of monochromatic aberrations. This technique is repeated with a second meniscus lens 184 to produce the second virtual image P2. The front surface 186 of the second lens 184 is positioned to have its center of curvature at P1. The radius of the rear surface 188 is designed so that its center of curvature is a distance r2/n1 from P1 where n1 is the refractive index of the lens and r2 is the radius of the rear surface 188 of the second element 184. The rays refracted from this surface form a magnified virtual image at the point P2. This makes point P2 an aplanatic point with respect to the intermediate virtual image point P1.

Adding additional menisci produces successive virtual images lying further and further away from the object. This reduces the angular divergence of the rays, increasing the numerical aperture. More than two corrected lenses are seldom employed because of the difficulty in adequately compensating for chromatic aberration. If a truly monochromatic source is used to observe the object, then additional lenses could be added to further increase the resolution.

Thus there has been disclosed a system for increasing the resolution of optical systems and more particularly for improving the resolution of lithographic systems through the use of resonant dielectric materials. Although the invention finds particular application in the field of dual-surface lithography for the fabrication of microwave semiconductor devices, other applications are disclosed and still further applications will be apparent to those of skill in the art. Accordingly, the true spirit and scope of the present invention is limited only by the following claims.

What is claimed is:

1. An optical system, comprising:
   a mask at least partially opaque to optical radiation of a predetermined frequency;
   a layer of photoimageable material spaced from said mask;
   an intermediate material positioned between said mask and said layer of photoimageable material, said intermediate material having a resonant dielectric increase characteristic which peaks at about the frequency of said optical radiation; and
   means directing optical radiation at said predetermined frequency through said mask and through said intermediate layer to expose said photoimageable material, said resonant dielectric increase substantially reducing the effective wavelength of said optical radiation to provide a high resolution image of said mask in said photoimageable material.

2. The optical system of claim 1, wherein said intermediate material is a thin film semiconductor material.

3. The optical system of claim 2 wherein said thin film is Gallium Arsenide, and wherein said optical radiation is mid-ultraviolet light.

4. The optical system of claim 2, wherein said layer of photoimageable material is formed on one surface of said thin film and said mask is formed on the opposite surface of said thin film.

5. The optical system of claim 1, wherein said intermediate material is a fluid.

6. The optical system of claim 5, wherein said photoimageable material is immersed in said fluid.

7. An optical system, comprising:
   an object to be viewed;
   an objective lens spaced from said object;
   means of directing monochromatic light of a predetermined frequency onto said object; and
   an intermediate material positioned between said object and said objective lens, said intermediate material having a resonant dielectric increase characteristic which peaks at about the frequency of said monochromatic light, whereby light from said object passes through said intermediate material to said objective lens.

* * * * *